United States Patent [19]
Tsubouchi et al.

[11] 3,767,579
[45] Oct. 23, 1973

[54] PIEZOELECTIRC CERAMICS

[75] Inventors: Norio Tsubouchi; Masao Takahashi, both of Tokyo, Japan

[73] Assignee: Nippon Electric Company Limited, Tokyo, Japan

[22] Filed: Feb. 23, 1972

[21] Appl. No.: 228,739

[30] Foreign Application Priority Data

Feb. 25, 1971 Japan .................................. 46/9776

[52] U.S. Cl. ............................................... 252/62.9
[51] Int. Cl. ........................ C04b 35/46, C04b 35/48
[58] Field of Search ................... 252/62.9; 106/39 R

[56] References Cited

UNITED STATES PATENTS

| | | | |
|---|---|---|---|
| 3,519,567 | 7/1970 | Tsubouchi et al. | 252/62.9 |
| 3,594,321 | 7/1971 | Ohno et al. | 252/62.9 |
| 3,637,506 | 1/1972 | Tanizake et al. | 252/62.9 |
| 3,595,795 | 7/1971 | Tsubouchi et al. | 252/62.9 |

FOREIGN PATENTS OR APPLICATIONS

| | | | |
|---|---|---|---|
| 1,926,812 | 2/1970 | Germany | 252/62.9 |

*Primary Examiner*—Oscar R. Vertiz
*Assistant Examiner*—U. Cooper
*Attorney*—Nichol M. Sandoe et al.

[57] ABSTRACT

A piezoelectric ceramic material is provided consisting essentially of a composition represented by the formula:

$$(Pb_{1-u} \cdot Bi_u) \cdot [M_t \cdot (Ni_{1/3} \cdot Nb_{2/3})_x \cdot Ti_y \cdot Zr_z] \cdot O_3,$$

wherein $M_t$ represents $Ni_{u/2}$ or $(Li_{1/2} \cdot Nb_{1/2})_u$ and wherein $t + x + y + z = 1.00$ and $u$, $x$, $y$, and $z$ are given by a set of following inequalities:

$0.02 \leq u \leq 0.40,$
$0.35 \leq x \leq 0.60,$
$0.20 \leq y \leq 0.50,$
and
$0.05 \leq z \leq 0.30.$

2 Claims, No Drawings

PIEZOELECTIRC CERAMICS

BACKGROUND OF THE INVENTION

This invention relates to a piezoelectric material and, more particularly, to piezoelectric ceramics having a large value of the electromechanical coupling coefficient ($K_r$), a considerably small value of the mechanical quality factor ($Q_m$), and a large value of the dielectric constant ($\epsilon$). The piezoelectric ceramics according to this invention are specifically excellent for use in wide-band filter elements, phonograph pickup elements, and the like.

Scientific evaluation of piezoelectric properties of a piezoelectric material generally makes use of the piezoelectric constant ($d$). As the value is larger, the piezoelectric properties are more excellent. On the other hand, the most fundamental constants for practical evaluation of a piezoelectric material are the electromechanical coupling coefficient and the mechanical quality factor. The former represents the efficiency of energy conversion from electric oscillation into mechanical vibration or vice versa. The larger the value thereof, the higher is the conversion efficiency. The latter represents the reciprocal proportion of the energy consumed within the material when the energy conversion takes place. The larger the value thereof, the smaller is the energy consumed. From practical point of view, the dielectric constant is another factor. This constant is sometimes desired to be large and sometimes small.

In the use of conventional piezoelectric materials, it has been required in most cases that the electromechanical coupling coefficient be adjustable to a desired specific value over a wide range between a large value and a small value and that the mechanical quality factor be maintained as large as possible depending on the requirement so as to minimize the energy consumption. When specifically used for pickup elements, the piezoelectric material is desired to have a large electromechanical coupling coefficient and also such a large dielectric constant as to assure reduction of the impedance in the low-frequency region. This is described, for example, in "Lead Zirconate-Titanate Piezoelectric Ceramics" by A. E. Crawford et al., appearing in "British J. Appl. Phys.," Vol. 12 (1961), pp. 529–534.

In some applications, it is desired that the electromechanical coupling coefficient and the dielectric constant be as large as possible and that the mechanical quality factor be as small as possible. When the mechanical quality factor decreases, the energy consumption within the material increases to bring about various disadvantages, such as increase in the insertion loss of a filter. A piezoelctric resonator having small mechanical quality factor, however, moderates the frequency dependency of the electric characteristics, such as the insertion loss of a filter, in the vicinity of the resonant frequency. It is therefore notable in case moderate frequency characteristics are desired in the vicinity of the resonant frequency that considerable advantages are obtained from piezoelectric materials having small mechanical quality factor. Recent progress in electronics has made it possible to comparatively easily compensate for the energy loss inside the material by means of other circuit elements, thereby enabling piezoelectric ceramics of small mechanical quality factors to be used. To cite some examples, it has thus turned possible to widen the pass band width (B) of a filter, theneby providing a wide-band filter, and to reduce the frequency dependency of the output of a pickup.

As regards filters, the pass band width is related to the constants of the piezoelectric ceramics as follows:

$$B \leq \overline{1/r + 1/Q_m},$$

where $r$ is generally termed the capacitance ratio and is a constant that tends to decrease with increase of the value of the electromechanical coupling coefficient. Prior attempts to broaden the pass band width of a filter have been directed to increasing of the value of the electromechanical coupling coefficient (decreasing of the value of the capacitance ratio). The rapid improvements in the characteristics of ceramic materials in recent years, however, have reached a limit such that further widening of the pass band width can not be much expected from the decrease of the capacitance ratio. Consequently, the value of the mechanical quality factor must be reduced in order to still broaden the pass band width of a filter.

An example of the piezoelectric materials having so reduced value of the mechanical quality factory is described in "Piezoelectric Pressure Transducer with Acoustic Absorbing Rod" by K. W. Ragland and R. E. Cullen, printed in "The Review of Scientific Instruments," Vol. 38 (1967), No. 6, pp. 740–742. As described in the article, lead metaniobate ($PbNb_2O_6$) is well known as a piezoelectric material of low mechanical quality factor. Although the value of the mechanical quality factor of lead metaniobate is as small as 5 through 15, the value of the electromechanical coupling coefficient thereof is also considerably reduced to less than 10 percent. Use of lead metaniobate is therefore much restricted.

Piezoelectric ceramics are known in which the mechanical quality factor is reduced while maintaining the electromechanical coupling coefficient at a large value. Examples are compositions including the main constituent of lead zirconate-titanate $Pb(Zr \cdot Ti)O_3$ well-known for its large value of the electromechanical coupling coefficient and additives of, for example, lanthanum oxide ($La_2O_3$), thorium oxide ($ThO_2$), niobium oxide ($Nb_2O_3$), tungsten oxide ($WO_3$), and others. For these piezoelectric materials, the value of the mechanical quality factor is reduced down to approximately 80 through 100 with the value of the electromechanical coupling coefficient maintained at approximately 60 percent.

In Japanese Patent Application No. Syo 45-37,907 published on Dec. 1, 1970, a short time before the Convention Date of the instant application, a piezoelectric ceramic material was revealed which comprises a ternary-system solid solution of $Pb(Ni_{1/3} \cdot Nb_{2/3})O_3$-$PbTiO_3$-$PbZrO_3$, having excellent piezoelectric characteristics and a large value of the dielectric constant. The published specification, however, is entirely mute as regards the value of the mechanical quality factor. It has now been found quite difficult with this ternary system to reduce the value of the mechanical quality factor down to 60 or below while maintaining the value of the electromechanical coupling coefficient at 50 percent or above. In addition, it has been found that the value of the mechanical quality factor of this ternary system has a large amount of scatter (a large standard deviation).

SUMMARY OF THE INVENTION

It is therefore an object of the present invention to provide a piezoelectric ceramic composition which has a smaller value of the mechanical quality factor than the known piezoelectric ceramics, while maintaining large values for both the electromechanical coupling coefficient and the dielectric constant.

It is another object of this invention to provide a piezoelectric ceramic composition of the type described whose value of the mechanical quality factor shows a markedly small deviation.

It is still another object of this invention to provide a piezoelectric ceramic composition of the type described which is suitable for manufacture.

It is a further object of this invention to provide a piezoelectric ceramic composition suitable for use in wide-band filter elements, phonograph pickup elements, and the like.

In accordance with this invention, novel piezoelectric ceramics have been synthesized which comprise a quinary solid solution, $Bi(Ni_{1/2}·Ti_{1/2})O_3$-$Bi(Ni_{1/2}·Zr_{1/2})O_3$-$Pb(Ni_{1/3}·Nb_{2/3})O_3$-$PbTiO_3$-$PbZrO_3$, or a quaternary solid solution having $Bi(Li_{1/2}·Nb_{1/2})O_3$ instead of $Bi(N_{1/2}·Ti_{1/2})O_3Bi(Ni_{1/2}·Zr_{1/2})O_3$ contained in the quinary solid solution. When the solid solutions are represented by the formula:

$$(Pb_{1-u}·Bi_u)·[M_t·(Ni_{1/3}·Nb_{2/3})_x·Ti_y·Zr_z]·O_3,$$

wherein $M_t$ represents $Ni_{u/2}$ or $(Li_{1/2}·Nb_{1/2})_u$ and wherein $t + x + y + z = 1.00$, the composition ratios $u$, $x$, $y$, and $z$ being given by a set of the following inequalities:

$0.02 \leq u \leq 0.40,$
$0.35 \leq x \leq 0.60,$
$0.20 \leq y \leq 0.50,$
and
$0.05 \leq z \leq 0.30.$ In further accordance with this invention, at least one of calcium, strontium, and barium selected from the alkaline-earth metals may be substituted for up to 10 percent of lead contained in the above-mentioned solid solution. It is now possible to represent the composition by the formula:

$$(Pb_{1-u-v}·Bi_u·AEM_v)·[M_t·(Ni_{1/3}·Nb_{2/3})_x·Ti_y·Zr_z]·O_3, \quad (1)$$

wherein AEM represents at least one of calcium, strontium, and barium and wherein the mol ratio $v$ is given by the following inequality:

$$0.00 \leq v \leq 0.10.$$

In the above-described solid solutions, lead, calcium, strontium, and barium act as divalent ions, bismuth and trivalent ions, and titanium and zirconium as tetravalent ions. In addition, the combinations $(Ni_{1/2}Ti_{1/2})$, $(Ni_{1/2}Zr_{1/2})$, and $(Li_{1/2}Nb_{1/2})$ are used in molecular ratios such that each combination will act as trivalent ions in effect. The combination $(Ni_{1/3}Nb_{2/3})$ is similarly used so as to act in effect as tetravalent ions.

DESCRIPTION OF THE PREFERRED EMBODIMENTS

The starting materials for the piezoelectric ceramics according to the instant invention are powdered lead oxide ($PbO$), bismuth oxide ($Bi_2O_3$), nickel oxide ($NiO$), lithium carbonate ($Li_2CO_3$), niobium oxide ($Nb_2O_5$), titanium oxide ($TiO_2$), zirconium oxide ($ZrO_2$), calcium carbonate ($CaCO_3$), strontium carbonate ($SrCO_3$), and/or barium carbonate ($BaCO_3$), all chemically pure (purity of 98 percent or more).

The respective powdered materials were weighed and mixed in a ball mill with distilled water. The mixture was dried, crushed, presintered for one hour at a temperature between 700°C and 900°C, and then crushed again. After addition of a small quantity of water, the crushed mixture was press-molded into discs of 20 mm in diameter at a pressure of 700 kg/cm$^2$, which were thereafter sintered for one hour at a temperature between 1,100°C and 1,250°C. The resulting piezoelectric ceramic discs were polished to the thickness of 1 mm. Each of thus obtained discs was provided with silver electrodes on both surfaces and then polarized under a D. C. electric field between 40 kV/cm and 50 kV/cm for one hour at a temperature between room temperature and 50°C. After the polarization, the piezoelectric ceramic specimens were left for 24 hours. In order to evaluate their piezoelectric properties, measurements were carried out for the electromechanical coupling coefficient in the radial mode, the mechanical quality factor, and the dielectric constant. The standard circuit of I. R. E. was resorted to for the measurements of the electromechanical coupling coefficient and the mechanical quality factor, the former being calculated from the resonant and the antiresonant frequencies. The dielectric constant was measured at a frequency of 1 kHz.

Typical results obtained for the piezoelectric ceramics produced according to the present invention with $Ni_{u/2}$ used for the symbol $M_t$ in the formula (1) and the piezoelectric ceramics similarly produced with the constituents given in the above-cited Japanese patent publication are shown in Table 1, wherein the symbols AEM, $u$, $x$, $y$, and $z$ are those appearing in the formula (1). Each value of the piezoelectric characteristics is a mean value for 10 to 20 specimens.

From Table 1, it is understood that the specimens Nos. 1 and 2 of the ternary system of $Pb(Ni_{1/3}Nb_{2/3})O_3$-$PbTiO_3$-$PbZrO_3$ given in the Japanese patent publication have large values of the mechanical quality factor and the deviation thereof. In contrast, the values of the mechanical quality factor of the quinary-system solid solution according to the instant invention are remarkably reduced to 50 or less, with the electromechanical coupling coefficient and the dielectric

TABLE 1

| Specimen No. | AEM | $u$ | $v$ | $x$ | $y$ | $z$ | $K_r$ (%) | $\epsilon$ | $Q_m$ | Standard deviation of $Q_m$ |
|---|---|---|---|---|---|---|---|---|---|---|
| 1 | | | | 0.40 | 0.37 | 0.23 | 69 | 3,960 | 65 | 13 |
| 2 | | | | .50 | .35 | .15 | 58 | 5,370 | 70 | 14 |
| 3 | | 0.02 | | .50 | .34 | .15 | 53 | 5,690 | 47 | 2.6 |
| 4 | | .05 | | .40 | .345 | .23 | 69 | 4,720 | 25 | 1.5 |
| 5 | | .05 | | .50 | .33 | .145 | 55 | 5,880 | 49 | 1.3 |
| 6 | | .10 | | .35 | .37 | .23 | 65 | 4,040 | 45 | 1.8 |
| 7 | | .20 | | .45 | .32 | .13 | 58 | 6,230 | 30 | 1.3 |
| 8 | Ca | .10 | 0.05 | .35 | .37 | .23 | 63 | 4,130 | 40 | 2.1 |
| 9 | Sr | .10 | .05 | .35 | .35 | .25 | 66 | 6,410 | 35 | 2.8 |
| 10 | Ba | .10 | .05 | .35 | .37 | .23 | 65 | 6,320 | 35 | 2.4 |

constant maintained at large values. The composition according to this invention is therefore excellent for use in wide-band filter elements, pickup elements, and others where reduction in the electric impedance is required. Furthermore, the deviations of the values of the mechanical quality factor are unexpectedly reduced in accordance with this invention. The latter fact is of the prime importance for a large-scale production. Incidentally, it is possible with substitution of at least one of calcium, strontium, and barium for up to 10 percent of lead contained in the compositions to attain a generally larger value of the dielectric constant while maintaining a large value of the electromechanical coupling coefficient and small values of both the mechanical quality factor and the deviation thereof.

Table 2 shows similar results achieved by the piezoelectric ceramics produced in accordance with the present invention with the combination $(Li_{1/2}Nb_{1/2})_u$ used for the symbol $M_t$ in the formula (1). From Table 2, it is understood that the combination $(Li_{1/2}Nb_{1/2})_u$ and the component $Bi(Li_{1/2}Nb_{1/2})O_3$ of the quaternary system are substantial equivalents of the element $Ni_{u/2}$ and the components $Bi(Ni_{1/2}Ti_{1/2})O_3$ plus $Bi(Ni_{1/2}Zr_{1/2})O_3$ of the quinary system, respectively, insofar as this invention is concerned.

TABLE 2

| Specimen No. | AEM | $u$ | $v$ | $x$ | $y$ | $z$ | $K_r$ (%) | $\epsilon$ | $Q_m$ | Standard deviation of $Q_m$ |
|---|---|---|---|---|---|---|---|---|---|---|
| 1 | | 0.05 | | 0.40 | 0.32 | 0.23 | 55 | 4,880 | 30 | 0.8 |
| 2 | | .10 | | .30 | .35 | .25 | 52 | 3,980 | 42 | 1.2 |
| 3 | Ba | .05 | 0.05 | .40 | .32 | .23 | 57 | 5,120 | 28 | 1.9 |

Besides the oxides and/or the carbonates given above, the starting materials may be those compounds which are easily decomposed at high temperatures into oxides, such as carbonates other than those enumerated above, oxalates, hydroxides, and the like. Furthermore, the raw materials may in advance be formed separately into $Pb(Ni_{1/3}Nb_{2/3})O_3$, $PbTiO_3$, and $PbZrO_3$, which are subsequently mixed together with other constituents in predetermined amounts. In this connection, it should be pointed out that the present invention covers the intermediate powdered products which, when sintered, are capable of resulting into the useful piezoelectric ceramics given by the formula (1).

It is general that commercially available niobium oxide ($Nb_2O_5$) and zirconium oxide ($ZrO_2$) contain up to several percent of tantalum oxide ($Ta_2O_5$) and hafnium oxide ($HfO_2$), respectively. It is, however, permissible for the piezoelectric ceramics according to the instant invention to contain tantalum and/or hafnium up to the percentages which would result from the use of the commercially available niobium oxide and zirconium oxide.

Outside the ranges specified above for lead, bismuth, calcium, strontium, barium, nickel, lithium, niobium, titanium, zirconium, oxygen, and the additional substantially unharmful elements, such as tantalum and hafnium, it has been found that one or more unfavorable effects will occur as regards the piezoelectric characteristics, such as decrease in the electromechanical coupling coefficient, increase in the mechanical quality factor, decrease in the dielectric constant, and decrease in the stability of the mechanical quality factor.

What is claimed is:

1. A piezoelectric ceramic material consisting essentially of a solid solution of $Bi(Ni_{1/2}Ti_{1/2})O_3$, $Bi(Ni_{1/2}Zr_{1/2})O_3$, $Pb(Ni_{1/3}Nb_{2/3})O_3$, $PbTiO_3$, and $PbZrO_3$, said solution being represented by the formula: $(Pb_{1-u-v}{\cdot}Bi_u{\cdot}AEM_v){\cdot}[Ni_{u/2}{\cdot}(Ni_{1/3}{\cdot}Nb_{2/3})_x{\cdot}Ti_y{\cdot}Zr_z]{\cdot}O_3$, wherein AEM represents at least one alkaline-earth metal element selected from the group consisting of Ca, Sr, and Ba and wherein $u/2 + x + y + z = 1.00$, the molecular ratios $u$, $x$, $y$, and $z$ being given by a set of the following inequalities:

$0.02 \leqq u \leqq 0.40,$
$0.00 \leqq v \leqq 0.10,$
$0.35 \leqq x \leqq 0.60,$
$0.20 \leqq y \leqq 0.50,$
$0.05 \leqq z \leqq 0.30.$

2. A piezoelectric ceramic material consisting essentially of a solid solution of $Bi(Li_{1/2}Nb_{1/2})O_3$, $Pb(Ni_{1/3}Nb_{2/3})O_3$, $PbTiO_3$, and $PbZrO_3$, said solid solution being represented by the formula: $(Pb_{1-u-v}\cdot Bi_u\cdot AEM_v)[(Li_{1/2}\cdot Nb_{1/2})_u\cdot(Ni_{1/3}\cdot Nb_{2/3})_x\cdot Ti_y\cdot Zr_z]\cdot O_3$, wherein AEM represents at least one alkaline-earth metal element selected from the group consisting of Ca, Sr, and Ba and wherein $u+x+y+z=1.00$, the molecular ratios $u$, $v$, $x$, $y$, and $z$ being given by a set of the following inequalities:

$0.02 \leq u \leq 0.40,$
$0.00 \leq v \leq 0.10,$
$0.35 \leq x \leq 0.60,$
$0.20 \leq y \leq 0.50,$
and
$0.05 \leq z \leq 0.30.$

* * * * *